United States Patent
Shao et al.

(10) Patent No.: US 11,445,631 B2
(45) Date of Patent: Sep. 13, 2022

(54) HIGH PERFORMANCE COMPUTING BASED HOLISTIC LIQUID COOLED RACK COST OPTIMIZATION

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 314 days.

(21) Appl. No.: 16/823,685

(22) Filed: Mar. 19, 2020

(65) Prior Publication Data

US 2021/0298191 A1 Sep. 23, 2021

(51) Int. Cl.
| | |
|---|---|
| *G06F 1/00* | (2006.01) |
| *H05K 7/14* | (2006.01) |
| *H05K 7/20* | (2006.01) |
| *G06N 20/00* | (2019.01) |
| *G06F 1/20* | (2006.01) |
| *G06F 1/324* | (2019.01) |
| *G06F 1/3228* | (2019.01) |

(52) U.S. Cl.
CPC .......... *H05K 7/1487* (2013.01); *G06F 1/206* (2013.01); *G06F 1/324* (2013.01); *G06F 1/3228* (2013.01); *G06N 20/00* (2019.01); *H05K 7/1488* (2013.01); *H05K 7/20272* (2013.01); *H05K 7/20281* (2013.01); *H05K 7/20772* (2013.01); *H05K 7/207* (2013.01); *H05K 7/20836* (2013.01); *Y02D 10/00* (2018.01)

(58) Field of Classification Search
CPC ............. H05K 7/1487; H05K 7/1488; H05K 7/20272; H05K 7/20281; H05K 7/20772; H05K 7/207; H05K 7/20836; H05K 7/20781; G06F 1/206; G06F 1/3228; G06F 1/324; G06F 2200/201; G06N 20/00; G06N 5/003; Y02D 10/00
USPC ........................................................ 706/19
See application file for complete search history.

(56) References Cited

U.S. PATENT DOCUMENTS

| | | | |
|---|---|---|---|
| 9,760,098 B1 * | 9/2017 | Imwalle | H05K 7/20836 |
| 2005/0083657 A1 * | 4/2005 | Hamman | F28D 15/00 |
| | | | 361/699 |
| 2010/0032142 A1 * | 2/2010 | Copeland | H05K 7/20836 |
| | | | 700/282 |

(Continued)

*Primary Examiner* — Volvick Derose
(74) *Attorney, Agent, or Firm* — Womble Bond Dickinson (US) LLP (57) ABSTRACT

An electronic rack includes an array of server blades arranged in a stack. Each server blade contains one or more servers and each server includes one or more processors to provide data processing services. The electronic rack includes a coolant distribution unit (CDU) and a rack management unit (RMU). The CDU supplies cooling liquid to the processors and receives the cooling liquid carrying heat from the processors. The CDU includes a liquid pump to pump the cooling liquid. The RMU is configured to manage the operations of the components within the electronic rack such as CDU, etc. The RMU includes control logic to determine an optimal pump speed and an optimal processor clock rate based on a first relationship between cost of the electronic rack and clock rate of the processors and a second relationship between energy consumption of the electronic rack, clock rate of the processors and pump speed.

20 Claims, 6 Drawing Sheets

(56) References Cited

U.S. PATENT DOCUMENTS

| | | | |
|---|---|---|---|
| 2014/0190681 A1* | 7/2014 | Chainer | H05K 7/20836 165/289 |
| 2016/0128238 A1* | 5/2016 | Shedd | H05K 7/20327 361/679.47 |
| 2019/0219295 A1* | 7/2019 | Wenzel | H02S 40/32 |
| 2020/0187388 A1* | 6/2020 | Chiu | H05K 7/20781 |
| 2022/0099661 A1* | 3/2022 | Kenten | G01N 33/5308 |
| 2022/0104402 A1* | 3/2022 | Gao | H05K 7/20836 |

* cited by examiner

HIGH PERFORMANCE COMPUTING BASED HOLISTIC LIQUID COOLED RACK COST OPTIMIZATION

FIELD OF THE DISCLOSURE

Embodiments of the present invention relate generally to data centers. More particularly, embodiments of the invention relate to holistic optimal performance control for liquid cooled electronic racks in data centers.

BACKGROUND

Thermal management of high power density chips and processors are critical problems, especially with the increasing of power density of high end chips, such as CPUs (central processing units) and GPUs (general-purpose processing units). Cooling devices are utilized in cooling system designs are used for maintaining the thermal conditions of the chips by removing the heat generated by the chips. If the temperature exceeds the limitation of the thermal specification, the chips may not function properly and throttling may happen. In addition, by providing proper or better thermal conditions for the chip when it is working, better performance or less power consumption can be achieved.

High performance machine learning computing is enabled by high power density processors, such as data center GPUs. The conventional air-cooling solution is struggling to handle the thermal management challenge in such GPU racks. Instead, cold plate liquid cooling solution provides much better cooling performance and saves energy consumption in cooling infrastructure.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure focus on optimization of the total cost of ownership for a liquid-cooled IT rack. The liquid cooled IT rack may include artificial intelligence (AI) acceleration servers (e.g., graphical processing unit (GPU) servers). A benchmark training time of a machine learning model may be included as an indicator of computing performance. The power consumption of the liquid-cooled IT rack includes the power consumption of the server(s) and power consumption of the liquid cooling solution (e.g., liquid pump). The most economical solution meets computing performance requirements (e.g., how fast to finish training a model) with the lowest acquisition cost and operational cost. Accordingly, a liquid-cooled IT equipment may be configured to minimize total ownership cost by determining an optimal chip clock rate and an optimal working temperature of the AI acceleration server. In particular, the cost optimization can be determined in view of 1) the acquisition cost of IT servers, 2) acquisition cost of the liquid cooling solution, 3) power consumption cost of IT servers, and 4) power consumption cost of liquid cooling equipment.

According to one aspect, an electronic rack includes an array of server blades arranged in a stack. Each server blade contains one or more servers and each server includes one or more processors to provide data processing services. The electronic rack further includes a coolant distribution unit (CDU) and a rack management unit (RMU). The CDU is configured to supply cooling liquid to the processors and to receive the cooling liquid carrying the heat exchanged from the processors. The CDU includes a liquid pump to pump the cooling liquid and a pump controller to control a pump speed of the liquid pump. The RMU is configured to manage the operations of the components within the electronic rack such as CDU, etc. The RMU includes control logic to determine a first relationship between a cost of the server and the clock rate of the processors of the server based on the performance requirement and to determine a second relationship between energy consumption of the server to perform a defined task, the clock rate of processors of the server, and a pump speed of the liquid pump. The RMU logic may further determine an optimized clock rate and an optimized pump speed based on the first relationship and the second relationship, and control the pump speed of the liquid pump via the pump controller based on the optimal pump speed and the clock rate of the one or more processors based on the optimal clock rate.

In one embodiment, determining the optimized clock rate and optimized pump speed includes optimizing an objective function such that the objective function reaches a minimum, while a set of predetermined constraints is satisfied. The set of predetermined constraints may include a first condition that a clock speed is within a predetermined clock speed range and a second condition that the pump speed of the liquid pump is within a predetermined pump speed range. In one embodiment, the objective function indicates a total cost of the server rack to train the machine learning model based on server acquisition cost, pump system acquisition cost, server power consumption cost, and pump system power consumption cost. In another embodiment, the objective function indicates a total cost of the server rack over an estimated lifetime of the server rack. The optimized clock rate and optimized pump speed may then be used during training of an artificial intelligence (AI) model to minimize cost of training the AI model. Determining the second relationship may further be based on the performance requirement and an operating temperature of the one or more processors.

According to another aspect, a method for determining optimal operating parameters for an electronic rack of a data center includes determining, for an electronic rack having a plurality of server blades, each server blade including one or more servers and each server including one or more processors to provide data processing services, a first relationship between a cost of the electronic rack and a clock rate of the one or more processors of the electronic rack based on a performance requirement of the electronic rack. The method further includes determining a second relationship between energy consumption of the electronic rack to perform a defined task, the clock rate of one or more processors, and a pump speed of the liquid pump of a coolant distribution unit (CDU) of the electronic rack. The method further includes determining an optimized clock rate and an optimized pump speed based on the first relationship and the second relationship, and controlling the pump speed of the liquid pump via the pump controller based on the optimal pump speed and the clock rate of the one or more processors based on the optimal clock rate.

Figure 1:
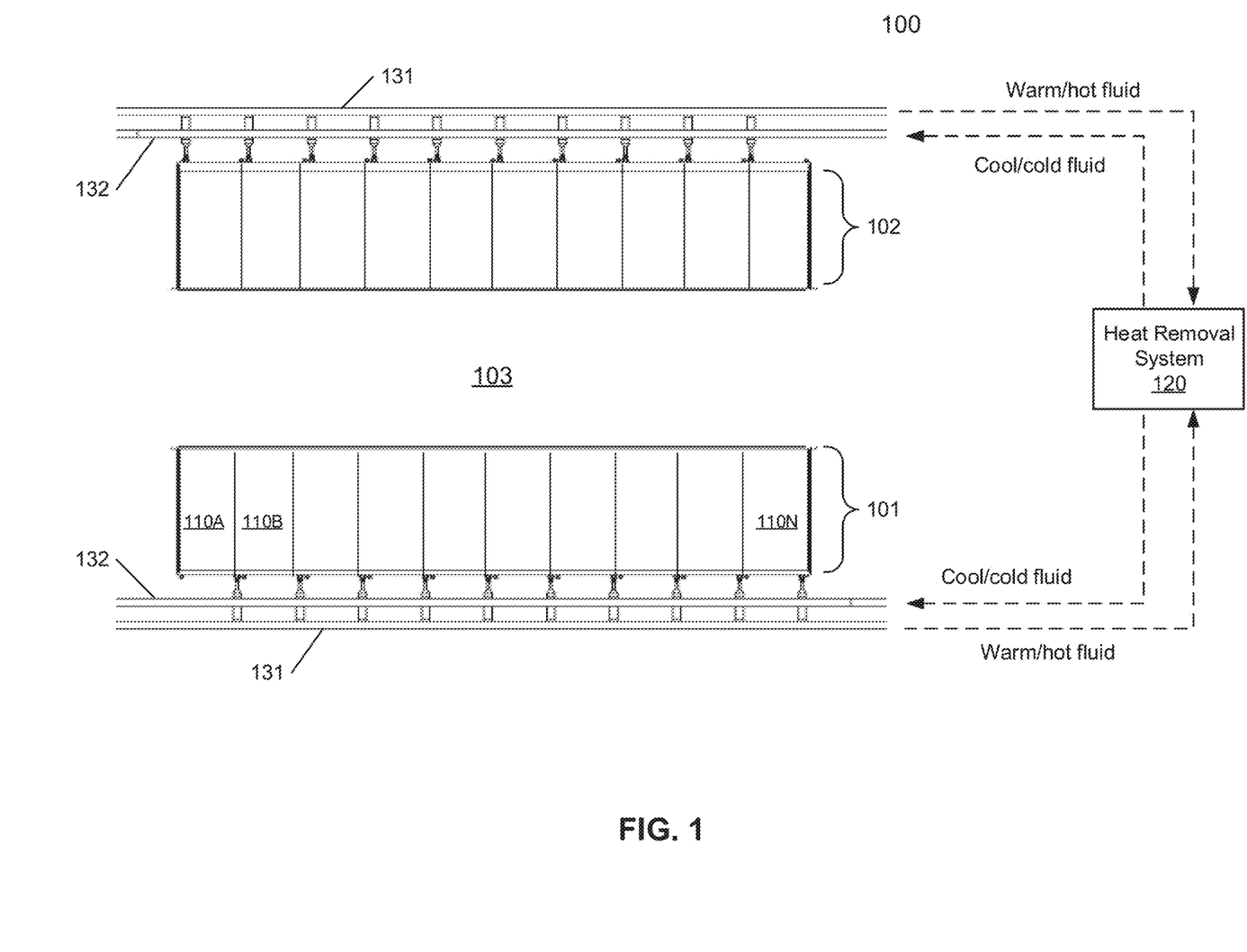
FIG. 1 is a block diagram illustrating an example of a data center system according to one embodiment.

FIG. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks, such as electronic racks 110A-110N, arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade can be inserted and removed from a corresponding server slot from a frontend of the electronic rack. Heat removal system 120 may be a chiller system with an active refrigeration cycle. Alternatively, heat removal system 120 can include, but is not limited to, evaporative cooling, free air, rejection to large thermal mass, and waste heat recovery designs.

In one embodiment, each of the electronic racks in rows 101-102 includes a heat removal liquid manifold, a number of server blades contained in a number of server blade slots respectively, and a coolant distribution unit (CDU). The heat removal liquid manifold is to provide heat removal liquid to each of the server blades. Each of the sever blades is to receive heat removal liquid from the heat removal liquid manifold to remove at least a portion of the heat generated by an IT component of the server blade using the heat removal liquid manifold, and to transmit warmer liquid carrying the heat exchanged from the IT component back to the heat removal liquid manifold. The CDU is configured to receive data representing a workload of the IT components of the server blades and to control a liquid flow rate of the heat removal liquid supplied to the heat removal liquid manifold based on the workload of the IT components of the server blades.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Figure 2:
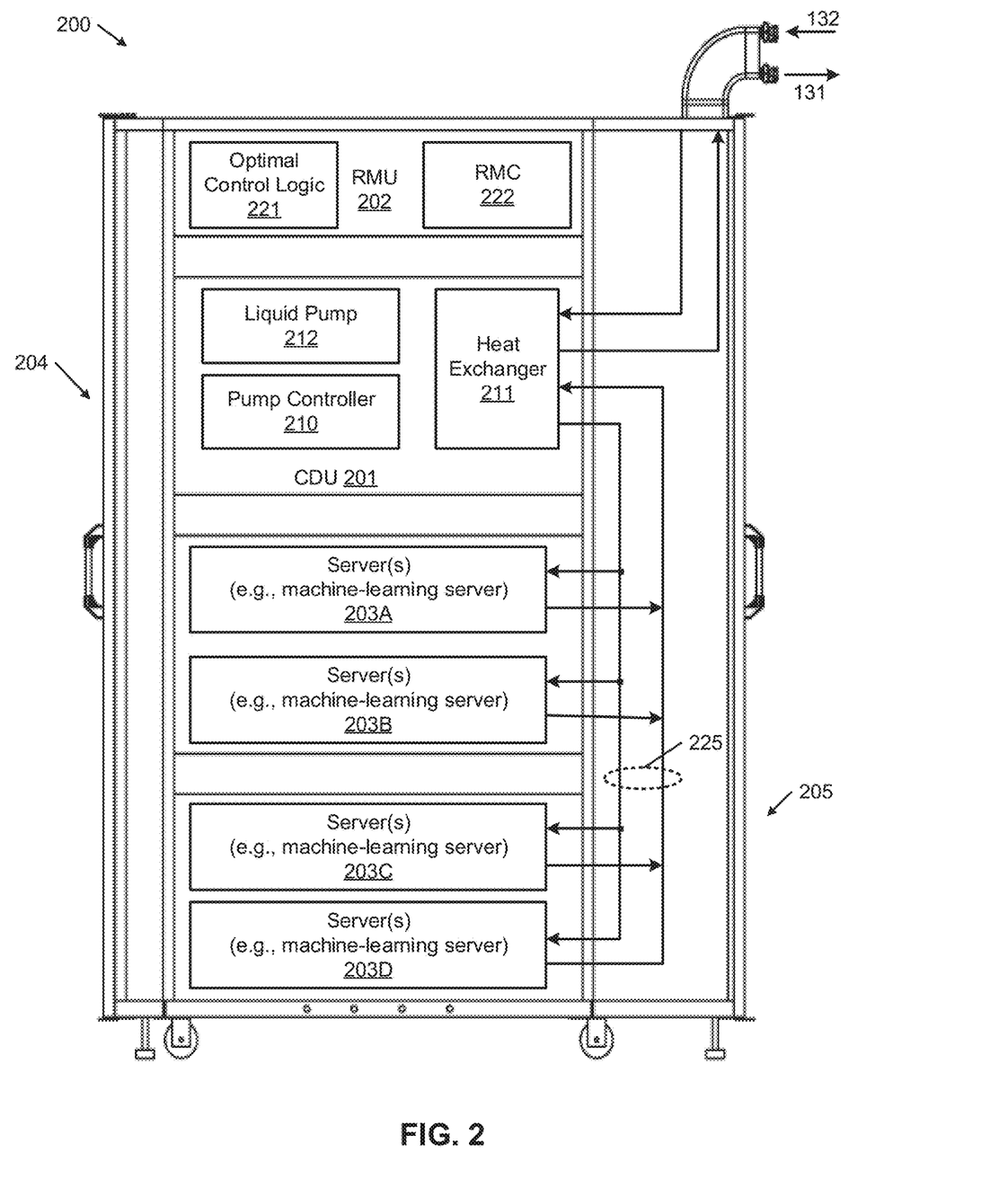
FIG. 2 is a block diagram illustrating an example of an electronic rack according to one embodiment.

FIG. 2 is a block diagram illustrating a side view of an electronic rack according to one embodiment of the invention. Electronic rack 200 may represent any of the electronic racks of rows 101-102 of FIG. 1, such as electronic racks 110A-110N. Referring to FIG. 2, in one embodiment, electronic rack 200 includes CDU 201, RMU 202, and one or more server blades 203A-203D, collectively referred to as server blades 203. Sever blades 203 can be inserted into an array of server slots respectively from frontend 204 of electronic rack 200. Note that although there are only four server blades 203A-203D shown in FIG. 2, more or fewer server blades may be maintained within electronic rack 200. Also note that the particular positions of CDU 201, CMU 202, and server blades 203 are shown for the purpose of illustration only; other arrangements or configurations of CDU 201, CMU 202, and server blades 203 may also be implemented. Further, the front door disposed on frontend 204 and the back door disposed on backend 205 are optional. In some situations, there may be no door on frontend 204 and/or backend 205.

In one embodiment, CDU 201 includes heat exchanger 211, liquid pump 212, and pump controller 210. Heat exchanger 211 may be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 may be disposed or mounted on backend 205 of electronic rack 200. In addition, heat exchanger 211 further includes a second tube having a second pair of liquid connectors coupled to liquid manifold 225, which may include a supply manifold to supply cooling liquid to server blades 203 and a return manifold to return warmer liquid back to CDU 201. The processors may be mounted on cold plates (or cold plates mounted on processors), where the cold plates include a liquid distribution channel embedded therein to receive the cooling liquid from the liquid manifold 225 and to return the cooling liquid carrying the heat exchanged from the processors back to the liquid manifold 225.

Each of server blades 203 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 200 further includes RMU 202 configured to provide and manage power supplied to server blades 203 and CDU 201. RMU 202 may be coupled to a power supply unit (not shown) to manage the power consumption of the power supply unit, as well as other thermal management of the power supply unit (e.g., cooling fans). The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimal control logic 221 and rack management controller (RMC) 222. The optimal control logic 221 is coupled to at least some of server blades 203 to receive an operating status of each of the server blades 203, such as processor temperatures of the processors, clock rate of the processors, the current pump speed of the liquid pump 212, liquid temperature of the cooling liquid, etc. Based on the received information, optimal control logic 221 determines 1) an optimal pump speed of the liquid pump 212 and 2) an optimal clock rate of the processors, by optimizing a predetermined objective function, such that the output of the objective function reaches the minimum while a set of predetermined constraints is satisfied. For example, the objective function may be an overall cost function of the server system. RMC 222 may be configured to send a signal to pump controller 210 to control the pump speed of liquid pump 212 based on the optimal pump speed. Additionally, RMC 222 may be configured to send a signal to the servers to control the clock rate of the processors based on the optimal clock rate.

Figure 3:
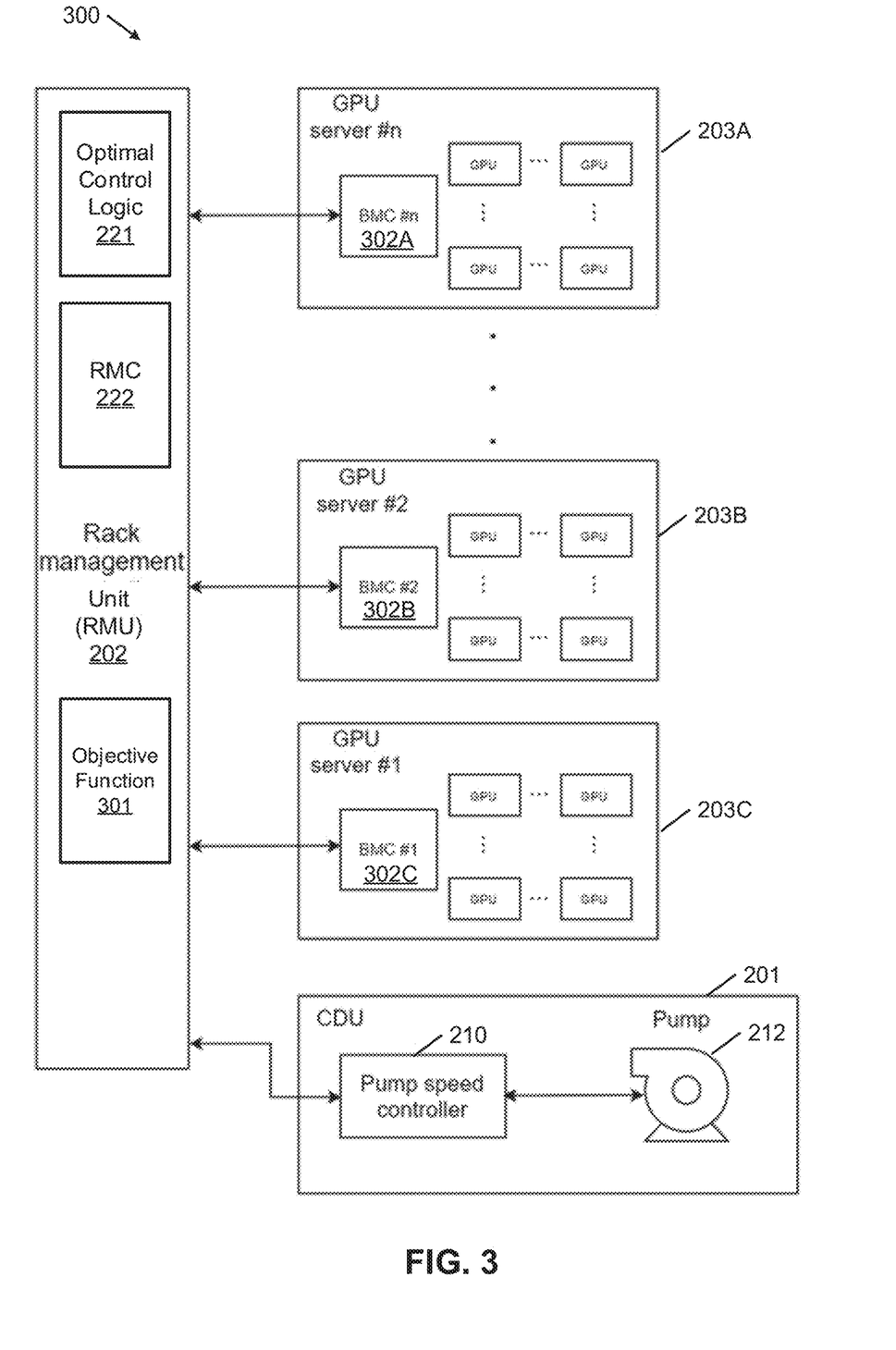
FIG. 3 is a block diagram illustrating an example of an electronic rack according to another embodiment.

FIG. 3 is a block diagram illustrating an example of a simplified electronic rack according to one embodiment. Electronic rack 300 may be implemented as a part of electronic rack, such as electronic rack 200 described with respect to FIG. 2. Referring to FIG. 3, RMU 202 is electrically coupled to servers 203. Specifically, RMU 202 may be coupled to a baseboard management controller (BMC) of each of servers 203 (e.g., BMCs 302A-302C, collectively referred to as BMCs 302). A BMC is configured to monitor and collect an operating status of each of the components of the corresponding server, such as measuring temperatures and clock rates of the processors and a pump speed of the CDU 201. The processor temperature of a processor may proportionally represent the power consumption of the processor. Furthermore, a clock rate and pump speed may be correlated with processor temperature. Thus, power consumption of the processor may be a function of clock rate and pump speed. In one embodiment, RMU 202 further includes optimal control logic 221 configured to perform an optimization of objective function 301 based on the data received from servers 203 to determine an optimal pump speed. Based on the optimal pump speed, RMC 222 sends a control signal to pump controller 210 to control the pump speed of liquid pump 212. Based on the optimal processor clock rate, the RMC 222 also sends a signal to the servers 203 to control the processor clock rate.

In one embodiment, electronic rack 300 includes an array of server blades 203 arranged in a stack. Each server blade contains one or more servers and each server includes one or more processors, such as GPUs, to provide data processing services. The electronic rack 300 further includes CDU 201 and RMU 202. The CDU 201 is configured to supply cooling liquid to the processors and to receive the cooling liquid carrying the heat exchanged from the processors. The CDU 201 includes a liquid pump 212 to pump the cooling liquid and a pump controller 210 to control a pump speed of the liquid pump. The RMU 202 is configured to manage the operations of the components within the electronic rack such as CDU 201, etc. The RMU 202 includes control logic to determine an optimal pump speed of the liquid pump 212 and an optimal clock rate by optimizing an objective function 301 based on acquisition cost of the servers 203 and CDU 201, the processor power consumption of the processors of servers 203, cooling power consumption of the CDU 201, and a performance requirement of the data processing services. The optimal pump speed may be used to control the pump speed of the liquid pump and the optimal clock rate may be used to control the processor clock rate of the servers 203. In one embodiment, the optimal pump speed and clock rate minimizes an overall cost of the server and cooling system to perform a particular defined task.

In one embodiment, the objective function 301 is to determine the optimal pump speed and processor clock rate such that the objective function 301 reaches a minimum while a set of predetermined constraints is satisfied. The predetermined constraints include a first condition of which the pump speed is within a defined range (e.g., between the minimum and maximum pump speed) and a second condition of which a processor clock rate of the servers 203 is within a defined range of clock rates (e.g., between the minimum and maximum clock rates).

In one embodiment, the acquisition cost of a server is based on the performance requirement of the server (e.g., minimum performance) and the time taken to perform a benchmark task (referred to as training time), such as training an AI model. The training time may directly depend on the processor clock rate. Thus, the acquisition cost in view of the benchmark performance requirement may be a function of processor clock rate. Therefore, the acquisition cost of the server system may be determined using a first function based on a processor clock rate.

In one embodiment, the acquisition cost of the liquid cooling solution (e.g., the CDU 201) may be a constant (e.g., the one-time cost of obtaining the cooling system). In one embodiment, the processor power consumption is the sum of the power consumption of all processors within the electronic rack. The processor power consumption may be determined using a second function based on a clock rate and pump speed of the liquid pump. In one embodiment, the cooling power consumption may be determined using a third function based on a current pump speed of the liquid pump. Therefore, the total overall cost of the server and cooling system may be determined using a fourth function based on the clock rate and pump speed of the liquid pump.

The benchmark performance measurement is determined based on a number of data samples and time to process the samples using a predetermined benchmark system corresponding to a type of the data processing services the servers configured to perform.

In one embodiment, optimal control logic 221 may be implemented in software, hardware, or a combination thereof. For example, optimal control logic 221 may be implemented as a field programmable gate array (FPGA) or an application specific integrated circuit (ASIC). Objective function 301 may be implemented as executable instructions that can be stored in a machine-readable storage medium, such as memory, and executed by optimal control logic 221.

In one embodiment, the objective function represents the total cost of the server rack system. The goal is to minimize overall cost while satisfying a benchmark performance requirement and a set of predetermined constraints. In one embodiment, the relevant considerations of the objective function (cost model) are: 1) acquisition cost of IT servers; 2) acquisition cost of the liquid cooling solution; 3) cost of power consumption of IT servers when running deep learning application; 4) cost of power consumption by liquid cooling equipment.

$$\text{Cost} = C_{server} + C_{cooling} + C_{server\ power} + C_{cooling\ power} \qquad (1)$$

These four components in the cost model expression are described individually in more detail below. First, optimal control logic 221 may determine the capital cost of IT servers $C_{server}$. To determine how many servers are necessary to meet the computing performance requirement for a deep learning application, a single server's performance under benchmark is used. Specific benchmarks for different application scenarios may be used to evaluate the computing system's performance. Each benchmark is considered to be representative of real life tasks in a certain application scenario. One example benchmark is shown in the table below. The training time is defined by running the benchmark. In this example, the servers need to process all the images in the dataset to finish the model training, where the ImageNet includes a total of N=1,281,167 images.

| Application Scenario | Dataset | Quality Target | Reference Implementation Model |
|---|---|---|---|
| Image classification | ImageNet | 75.9% Top-1 Accuracy | Resnet-50 v1.5 |

The computing performance can be quantified as processing speed. For a single server, processing speed may be expressed as $$S_{server} = \frac{N_{benchmark}}{t_{training}} \qquad (2)$$

$N_{benchmark}$ may be the total number of samples in the benchmark dataset, and $t_{training}$ may be the time needed to finish training the model. Defining the processing speed of a single server as $S_{sever}$, and the performance requirement of the entire server system as $S_{demand}$, the number of IT servers needed to meet the performance requirement may be expressed as, $$N_{server} = \frac{S_{demand}}{S_{server}} \qquad (3)$$

The acquisition cost of the server system $C_{server}$ is $$C_{server} = C_s \times N_{server} \qquad (4)$$

where $C_s$ is the unit price of an AI acceleration server. The overall configuration of servers $C_{server}$ may be a set of servers including a host server (e.g., a CPU server) together with several GPU servers. Substituting equations (2) and (3) into equation (4) we get equation (5) below.

$$C_{server} = C_s \times \frac{S_{demand}}{S_{server}} = C_s \times \frac{S_{demand}}{N_{benchmark}} \times t_{training} \qquad (5)$$

Figure 4:
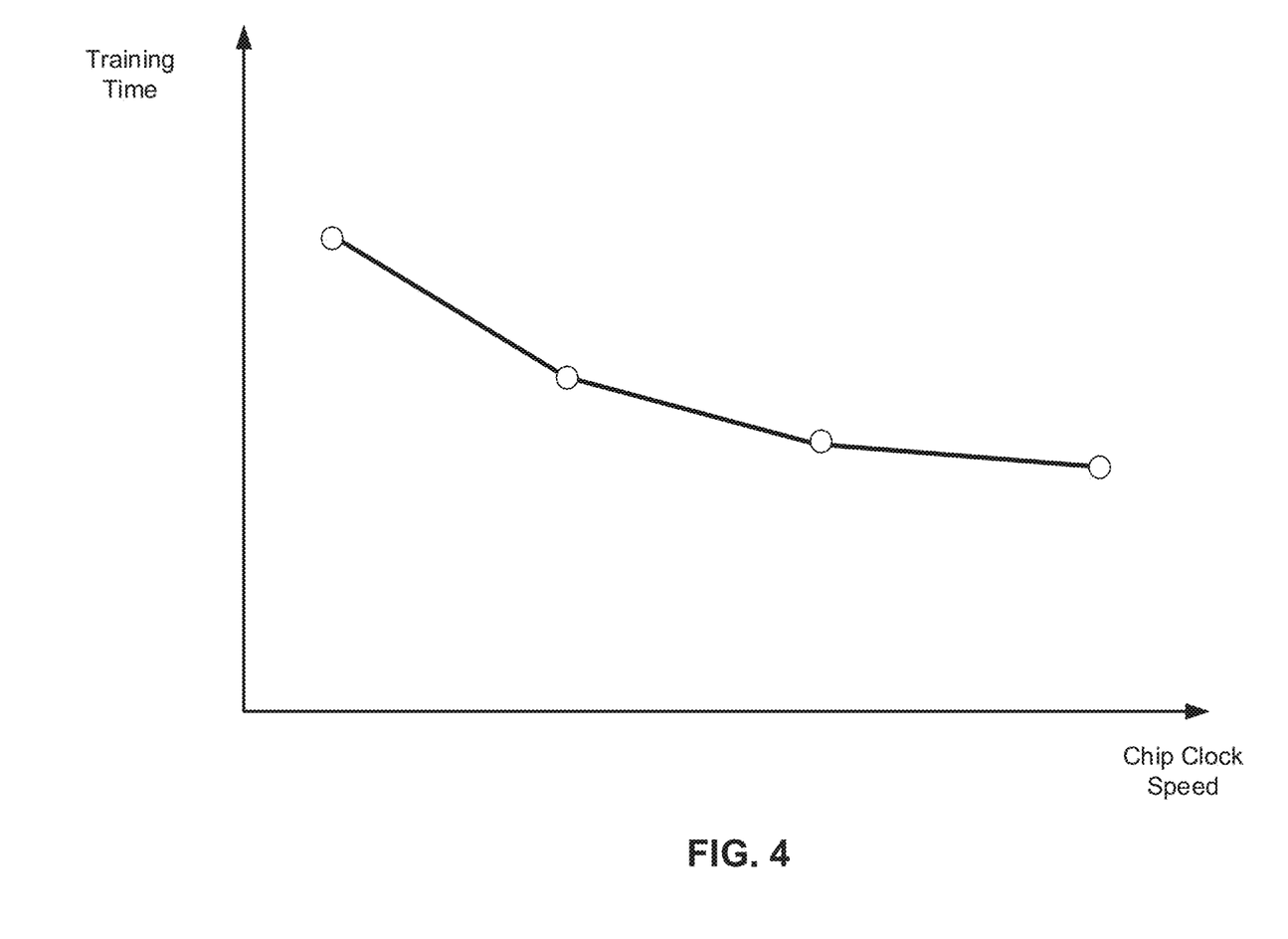
FIG. 4 is a diagram illustrating an example correlation between chip clock speed and a benchmark training time according to one embodiment.

Note that the acquisition cost of the server system $C_{server}$ is proportional to the training time $t_{training}$ while other terms can be considered as constant during optimization. Referring to FIG. 4, $t_{training}$ can be expressed as a function of processor clock $f_{clock}$, which yields $$C_{server} = C_s \times \frac{S_{demand}}{N_{benchmark}} \times f_1(f_{clock}) \qquad (6)$$

Figure 5:
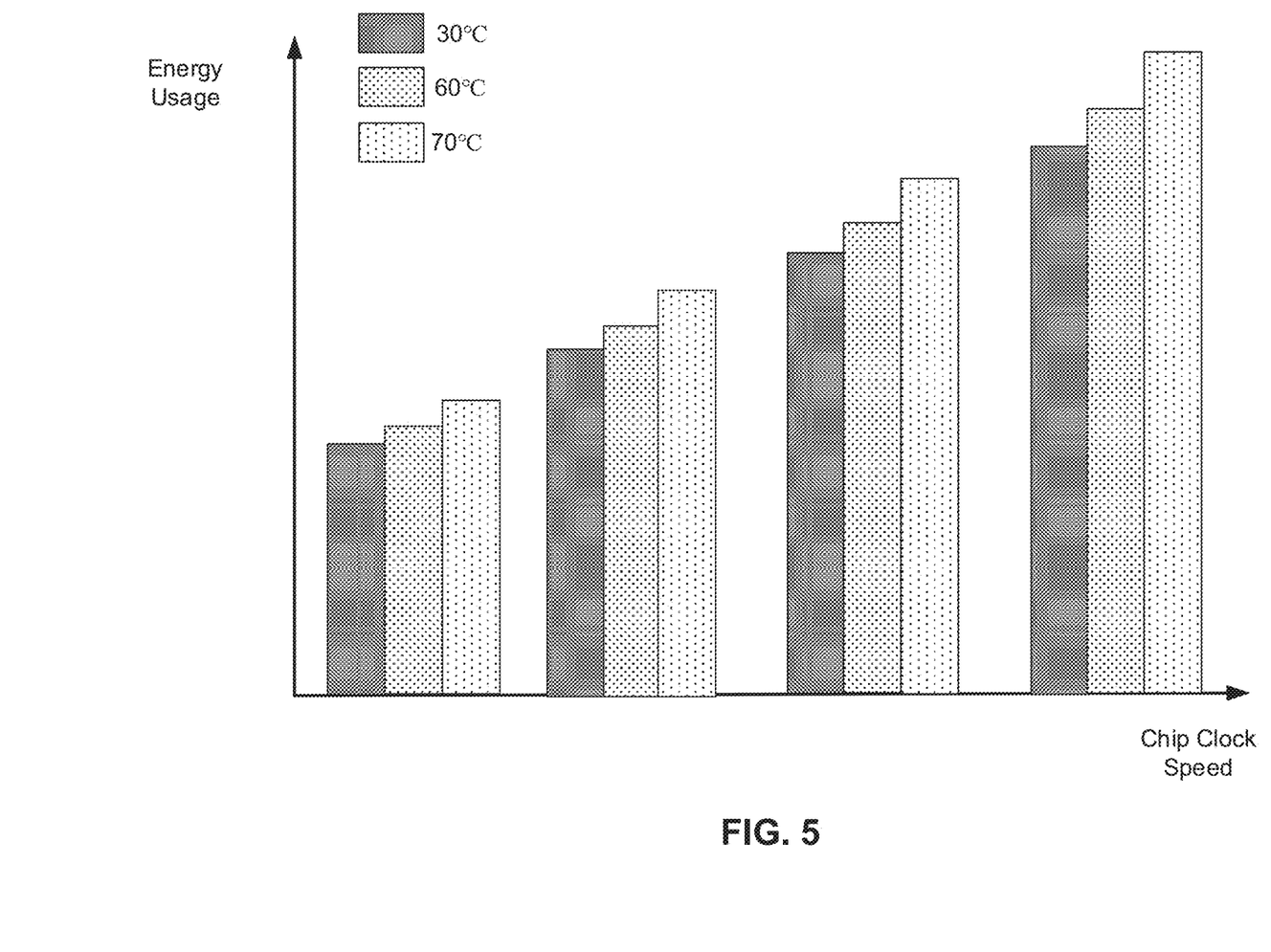
FIG. 5 is a diagram illustrating an example correlation between energy usage of a server, temperature of the processor, and clock speed.

Next, the optimal control logic 222 may further determine the energy consumption and energy cost of IT servers. The cost of IT server power consumption may be represented by the training time. At a given chip temperature and a chip clock, to finish a model training the amount of energy consumption to train the model may be quantified and determined based on a given chip temperature and chip clock. One example is shown in FIG. 5. Note that this energy value is the integration of the power consumption over the training time (e.g., the energy value is the total power consumed over the training time). Chip clock may be the directly controlled parameter for power consumption and temperature an indirectly controlled parameter. When the benchmark work load is running on IT equipment with liquid cooling, the chip temperature can be determined by the pump speed $v_{pump}$ in the liquid loop. Thus, the directly controlled parameter for chip temperature is the speed of the liquid pump $v_{pump}$. Combining the two relations of chip clock and temperature to power consumption and pump speed to temperature, we have $$E_{server} = f_2(f_{clock}, v_{pump}) \qquad (7)$$

where, $E_{server}$ is the total energy consumed by the server to finish training the model under the benchmark performance requirements.

Energy consumption by liquid cooling solution is directly dependent upon the pump speed of the liquid cooling pump. The cooling power is consumed by the pump to drive the fluid during running a benchmark task.

$$E_{cooling} = t_{training} \times (b \times v_{pump}^3) \qquad (8)$$

Where b is a constant from pump power consumption curve. Finally, the acquisition cost of the liquid cooling solution $C_{cooling}$ may be considered a constant for purposes of calculation and optimization of total cost.

The overall objective function is $$\text{Cost} = C_{server} + C_{cooling} + C_{server\ power} + C_{cooling\ power} = \qquad (9)$$
$$C_{server} + C_{cooling} + \frac{t_{life}}{t_{training}} C_r E_{server} + \frac{t_{life}}{t_{training}} C_r E_{cooling}$$

where $C_r$ is electricity rate. To make sense about the summation of acquisition cost and electricity energy cost in operation, $t_{life}$ is introduced as the service life of the entire IT equipment for the electricity energy cost. Replacing $t_{training}$ with a function of chip clock $f_{clock}$ referring to FIG. 4A, together with plugging Equation (6), (7), (8), and we have the final cost model depicted below.

$$\text{Cost} = C_s \frac{S_{demand}}{N_{benchmark}} f_1(f_{clock}) + C_{cooling} + \frac{t_{life}}{f_1(f_{clock})} C_r f_2(f_{clock}, v_{pump}) + C_r t_{life}(bv_{pump}^3) \quad (10)$$

The direct controlling parameters are the chip clock $f_{clock}$ and the pump's speed $v_{pump}$ in the liquid cooling loop. Chip clock $f_{clock}$ may be bounded within a range of clock rates (e.g., upper and lower limits). The pump speed may also be bounded within a range of pump speeds (e.g., upper and lower pump speed limits). Therefore the lowest cost can be reached with an optimally chosen parameter set of clock rate and pump speed ($f_{clock}^*$, $v_{pump}^*$).

Figure 6:
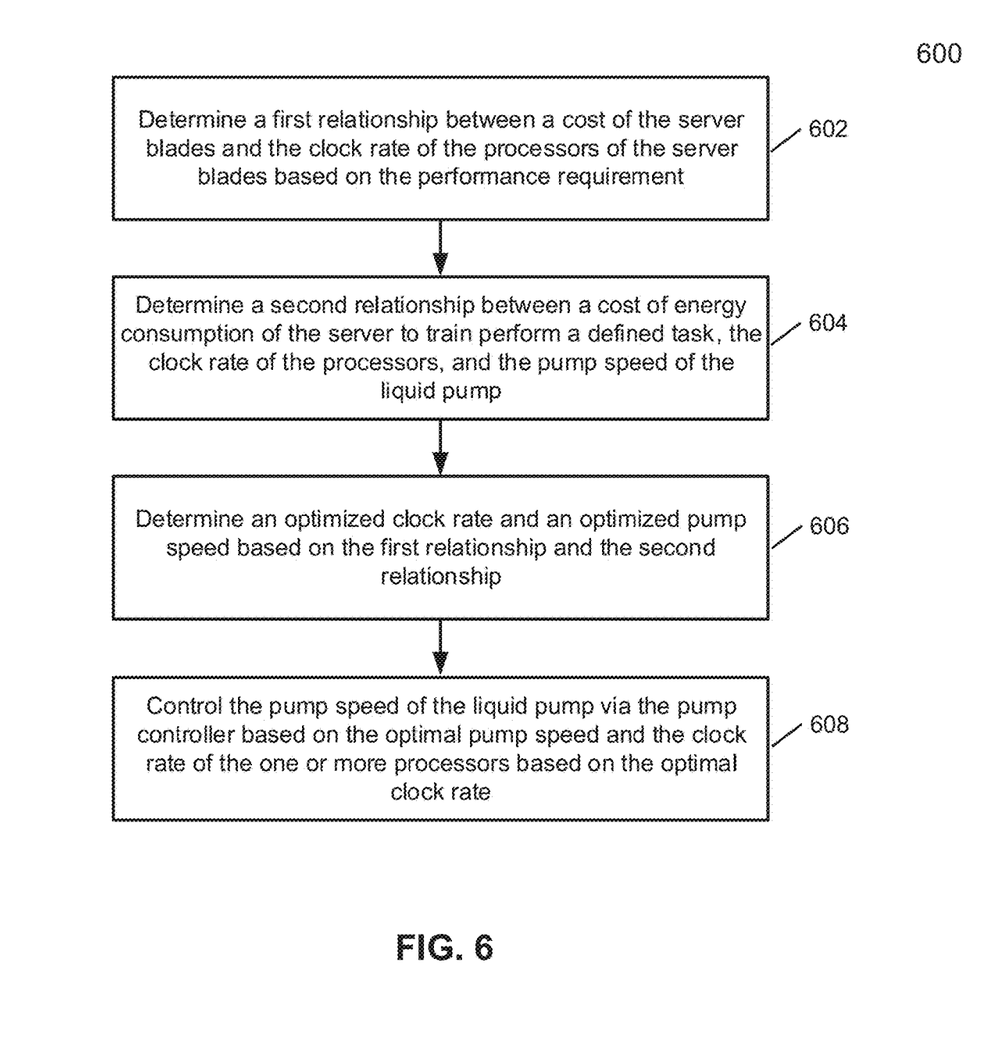
FIG. 6 is a flow diagram illustrating a process of determining an optimal pump speed and clock speed according to one embodiment.

FIG. 6 is a flow diagram illustrating an example of a process for determining an optimal pump speed of a liquid pump and processing clock rate according to one embodiment. Process 600 may be performed by processing logic which may include software, hardware, or a combination thereof. For example, process 600 may be performed by optimal control logic 221 of RMU 202 of FIG. 2. Referring to FIG. 6, at block 602, processing logic determines a first relationship between a cost of the server blades and the clock rate of the processors of the server bladed based on the performance requirement. The first relationship may indicate the acquisition cost of the server blades in terms of the performance requirement and as a function of the clock rate of the processors. Thus, the acquisition cost of the server blades in a particular benchmark scenario with a defined performance requirement is directly correlated with the clock rate of the processors.

At block 604, processing logic determines a second relationship between a cost of energy consumption of the server blades to perform a benchmark task, the clock rate of the processors, and the pump speed of the liquid pump. The second relationship may define the energy consumption and thus energy cost of the server bladed to perform the benchmark task. In particular, the energy cost of the server blade is directly related to the time required to train the model and the power consumption of the model which directly depend on the clock rate of the processors (i.e., the higher the clock rate the higher the power consumption per unit of time but the lower the training time and vice versa). Furthermore, the power consumption of the processors at a particular clock speed, as depicted in FIG. 4B, is dependent on the temperature of the processor. The temperature of the processors is determined by the pump speed (i.e., the rate that heat is extracted from the processors depends on the pump speed). Therefore, the cost of energy consumption of the server blades to perform the task directly depends on the clock rate and pump speed of the liquid pump.

At block 606, processing logic determines an optimized clock rate and an optimized pump speed based on the first relationship and the second relationship. To determine the optimized clock rate and optimized pump speed, the processing logic may minimize and objective function, where the objective function is the overall cost of the server rack system and the cooling system. The first relationship and second relationship may represent one or more terms of the objective function. The objective function may indicate a total cost of the server rack to train the machine learning model based on server acquisition cost, pump system acquisition cost, server power consumption cost, and pump system power consumption cost. The objective function may further indicate the total cost of the server rack over the estimated lifetime of the server rack.

At block 608, processing logic controls the pump speed of the liquid pump via the pump controller based on the optimal pump speed and the clock rate of the one or more processors based on the optimal clock rate. The optimal pump speed and clock rate may be used to perform another task related to the benchmark task. The another task may be the training of a real-life AI model while the benchmark task may be a task to test performance of the server rack system.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An electronic rack of a data center, comprising:
   a plurality of server blades arranged in a stack, each server blades containing one or more servers and each server including one or more processors to provide data processing services;
   a coolant distribution unit (CDU) to supply cooling liquid to the processors and to receive the cooling liquid carrying heat exchanged from the processors, wherein the CDU includes a liquid pump to pump the cooling liquid and a pump controller to control a pump speed of the liquid pump; and
   a rack management unit (RMU) coupled to the server blades and the CDU, wherein the RMU includes control logic configured to
      determine a first relationship between a cost of each server and a clock rate of the one or more processors of the server based on a performance requirement of the electronic rack,
      determine a second relationship between energy consumption of the server to perform a defined task, the clock rate of processors of the server, and a pump speed of the liquid pump,
      determine an optimal clock rate and an optimal pump speed based on the first relationship and the second relationship, and
      control the pump speed of the liquid pump via the pump controller based on the optimal pump speed and control the optimal clock rate of the one or more processors based on the optimal clock rate.

2. The electronic rack of claim 1, wherein determining the optimized clock rate and optimized pump speed comprises optimizing an objective function such that the objective function reaches a minimum, while a set of predetermined constraints is satisfied.

3. The electronic rack of claim 2, wherein the set of predetermined constraints comprises:
   a first condition that a clock speed is within a predetermined clock speed range; and
   a second condition that the pump speed of the liquid pump is within a predetermined pump speed range.

4. The electronic rack of claim 2, wherein the objective function indicates a total cost of the electronic rack to train a machine learning model based on at least one of server acquisition cost, pump system acquisition cost, server power consumption cost, or pump system power consumption cost.

5. The electronic rack of claim 2, wherein the objective function indicates a total cost of the electronic rack over an estimated lifetime of the electronic rack.

6. The electronic rack of claim 1, wherein the optimized clock rate and optimized pump speed are used during training of an artificial intelligence (AI) model to minimize cost of training the AI model.

7. The electronic rack of claim 1, wherein determining the second relationship is further based on an operating temperature of the one or more processors.

8. A method for determining optimal operating parameters for an electronic rack of a data center, the method comprising:
   determining, for an electronic rack having a plurality of server blades, each server blade including one or more servers and each server including one or more processors to provide data processing services, a first relationship between a cost of the electronic rack and a clock rate of the one or more processors of the electronic rack based on a performance requirement of the electronic rack;
   determining a second relationship between energy consumption of the electronic rack to perform a defined task, a clock rate of one or more processors, and a pump speed of a liquid pump of a coolant distribution unit (CDU) of the electronic rack;
   determining an optimized clock rate and an optimized pump speed based on the first relationship and the second relationship; and
   controlling the pump speed of the liquid pump via a pump controller based on the optimal pump speed and controlling the clock rate of the one or more processors based on the optimal clock rate.

9. The method of claim 8, wherein determining the optimized clock rate and optimized pump speed comprises optimizing an objective function such that the objective function reaches a minimum, while a set of predetermined constraints is satisfied.

10. The method of claim 9, wherein the set of predetermined constraints comprises:
    a first condition that a clock speed is within a predetermined clock speed range; and
    a second condition that the pump speed of the liquid pump is within a predetermined pump speed range.

11. The method of claim 9, wherein the objective function indicates a total cost of the electronic rack to train a machine learning model based on at least one of server acquisition cost, pump system acquisition cost, server power consumption cost, or pump system power consumption cost.

12. The method of claim 9, wherein the objective function indicates a total cost of the electronic rack over an estimated lifetime of the electronic rack.

13. The method of claim 8, wherein the optimized clock rate and optimized pump speed are used during training of an artificial intelligence (AI) model to minimize cost of training the AI model.

14. The method of claim 8, wherein determining the second relationship further is based on an operating temperature of the one or more processors.

15. A non-transitory machine-readable medium having instructions stored therein, which when executed by a processor, cause the processor to perform operations of determining optimal operating parameters for an electronic rack of a data center, the operations comprising:
    determining, for an electronic rack having a plurality of server blades, each server blade including one or more servers and each server including one or more processors to provide data processing services, a first relationship between a cost of the electronic rack and a clock rate of the one or more processors of the electronic rack based on a performance requirement of the electronic rack;

determining a second relationship between energy consumption of the electronic rack to perform a defined task, the clock rate of one or more processors, and a pump speed of a liquid pump of a coolant distribution unit (CDU) of the electronic rack;

determining an optimized clock rate and an optimized pump speed based on the first relationship and the second relationship; and controlling the pump speed of the liquid pump via the pump controller based on the optimal pump speed and controlling the clock rate of the one or more processors based on the optimal clock rate.

16. The non-transitory machine-readable medium of claim 15, wherein determining the optimized clock rate and optimized pump speed comprises optimizing an objective function such that the objective function reaches a minimum, while a set of predetermined constraints is satisfied.

17. The non-transitory machine-readable medium of claim 16, wherein the set of predetermined constraints comprises:
a first condition that a clock speed is within a predetermined clock speed range; and
a second condition that the pump speed of the liquid pump is within a predetermined pump speed range.

18. The non-transitory machine-readable medium of claim 16, wherein the objective function indicates a total cost of the electronic rack to train a machine learning model based on at least one of server acquisition cost, pump system acquisition cost, server power consumption cost, or pump system power consumption cost.

19. The non-transitory machine-readable medium of claim 16, wherein the objective function indicates a total cost of the electronic rack over an estimated lifetime of the electronic rack.

20. The non-transitory machine-readable medium of claim 15, wherein the optimized clock rate and optimized pump speed are used during training of an artificial intelligence (AI) model to minimize cost of training the AI model.

* * * * *